United States Patent [19]

Chow et al.

[11] Patent Number: 4,932,001

[45] Date of Patent: Jun. 5, 1990

[54] REDUCING POWER CONSUMPTION IN ON-CHIP MEMORY DEVICES

[75] Inventors: David G. L. Chow, Austin, Tex.; Jack M. S. Liu, Tempe, Ariz.

[73] Assignee: Advanced Micro Devices, Inc., Sunnyvale, Calif.

[21] Appl. No.: 256,682

[22] Filed: Oct. 12, 1988

[51] Int. Cl.$^5$ ............................................. G11C 7/00
[52] U.S. Cl. ................................. 365/233.5; 365/203
[58] Field of Search .................... 365/203, 233.5, 233, 365/190

[56] References Cited

U.S. PATENT DOCUMENTS 4,612,631  9/1986  Ochii .................................. 365/203

Primary Examiner—Joseph A. Popek
Attorney, Agent, or Firm—Salzman & Levy

[57] ABSTRACT

An on-chip semiconductor memory device in which power consumption is significantly decreased by restricting pre-charging of the bit lines to only those clock cycles for which there is a change in word line address.

5 Claims, 6 Drawing Sheets

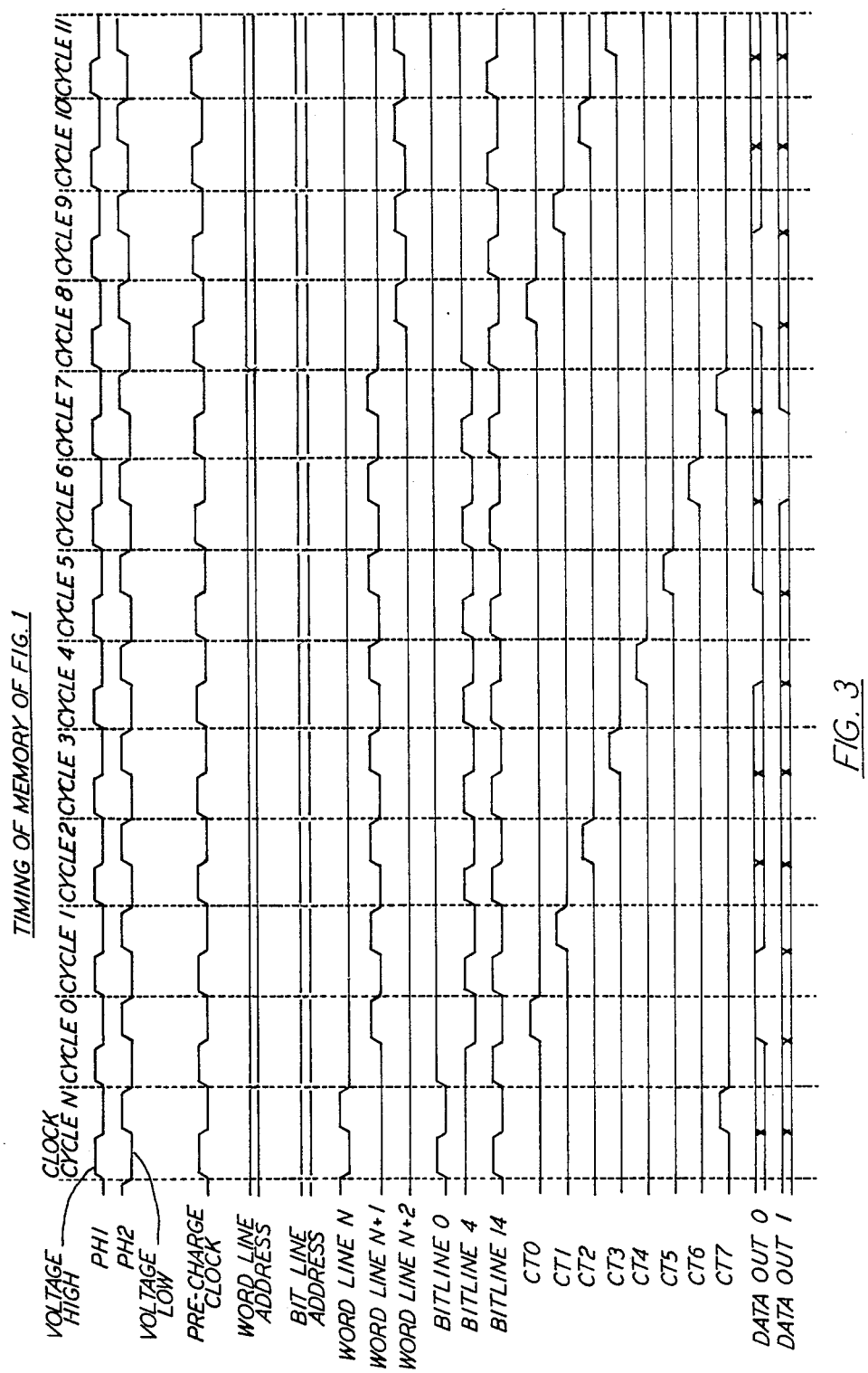

REDUCING POWER CONSUMPTION IN ON-CHIP MEMORY DEVICES

BACKGROUND OF THE INVENTION

The present invention relates to semiconductor memories, and more particularly to improvements in semiconductor memories of the type integrated on-chip in large scale and very large scale semiconductor monolithic integrated circuits, such improvements being directed to, and affording, reduced power consumption.

A semiconductor memory of the "on-chip" type is a memory disposed and arranged within the chip (i.e., the semiconductor body) of a monolithic integrated circuit in integral association with other portions of the body constituting, for example, the master clock, logic, control, and other functional portions of the total circuit. Such an on-chip memory is to be distinguished from a semiconductor memory of the stand-alone type, where in effect the semiconductor body containing the memory constitutes only the memory, and does not include other significant portions not directly associated and involved with the functioning of the memory.

Other significant differences between on-chip semiconductor memories and those of the stand-alone type derive from the fact that a stand-alone memory is an asynchronous device and an on-chip memory is not. This means that the internal control clock signals of the stand-alone memory are generated from asynchronous external signals. By contrast, with an on-chip memory the clock signals for the memory are internally derived and provided on the chip from, and in synchronization with, the output of the same clock used to time the logic, control and other functional portions of the total circuit.

It is also characteristic of on-chip memories that accesses are generally much more frequent than is usually the case in a stand-alone memory. For example, with an instruction read only memory (ROM) on-chip in association with a micro-code driven compute engine, memory access would normally occur in every clock cycle, in contrast to the merely intermittent clock cycle access normally characteristic of a stand-alone memory.

Briefly the present invention is derived in part from the recognition that in semiconductor memories of the ROM or RAM (random access memory) type, having bit lines and intersecting word lines and an array of memory cells associated with the intersections of such bit lines and word lines, much of the power consumption results from the requirement for pre-conditioning to a selected voltage state (so-called "pre-charging") and subsequent discharging of the bit lines.

Such pre-charging of the bit lines normally involves causing the bit line voltage to assume a selected, usually high, level, so as to avoid disturbing both selected and unselected memory cells during a read-out or other desired memory cell exercising operation. This pre-charging normally occurs during every access cycle, and hence this power consumption problem is particularly significant and burdensome in on-chip semiconductor memories where access is normally most frequent and usually occurs during every clock cycle.

The larger the memory in terms of number and length of bit lines, the greater is the corresponding pre-charging power consumption because of the large parasitic bit line capacitances. Such capacitance-related power consumption, of course, also increases with the operational frequency or clock rate of the memory.

Prior art attempts to solve problems of excessive power consumption in stand-alone memories have been directed to measures for pre-charging only selected ones, rather than all, of the bit lines, and to other measures for monitoring the state of charge of the bit lines, recharging them only when and as the charge voltage falls below a desired level. However, such measures involve complex additional monitoring and control circuitry and do not provide practical or satisfactory solutions to the power consumption problem of on-chip memories where the logic, control and other functional portions integrated in the monolithic chip circuit of which the memory is a part make addition of further circuitry undesirable if not totally impractical.

SUMMARY OF THE INVENTION

In accordance with the present invention, power consumption in an on-chip memory is significantly reduced by achieving a substantial reduction in bit line pre-charging power consumption. The bit line pre-charging power is effectively and significantly reduced by eliminating the prior art arrangement of pre-charging the bit lines in each and every access cycle, and instead pre-charging the bit lines only for those cycles at which there is a change of word line address. Thus in the absence of a word line address change, the pre-charging is caused to occur only once in a number of access cycles. For example if there are eight sequential bit line access cycles for a given word line, without a change in word line address, only one bit line charging will be provided for all eight accesses. Hence, the bit line charging power consumption will be reduced by a factor of eight. With still more bit line accesses per word line address, a correspondingly larger reduction in power consumption will be achieved in accordance with the present invention.

Accordingly, one object of the present invention is to provide an improved on-chip semiconductor memory having significantly reduced power consumption.

Another object of the invention is to provide such a memory in which the significant reduction of power consumption is achieved without adverse effect on the operational speed of the memory.

Yet another object is to provide such an improved semiconductor memory of the on-chip ROM or RAM type wherein the reduction in power consumption is obtained through improvements in the memory control means, without requiring any modification in the toplogy, manufacturing processing or design features of the memory itself or of the individual cells of the memory.

Still another object is to provide such improved performance in memories of the MOS transistor type, wherein reduced power consumption without sacrifice in speed is an important consideration, and wherein the invention further affords improved efficiency.

BRIEF DESCRIPTION OF THE DRAWINGS

These and other objects and advantages of the present invention will be apparent from the following more detailed description and the accompanying drawings, wherein:

FIG. 3 is a timing diagram of the principal voltage signals occurring in operation of the memory apparatus of FIGS. 1 and 2 according to the prior art;

DESCRIPTION OF THE PREFERRED EMBODIMENT

Figure 1:
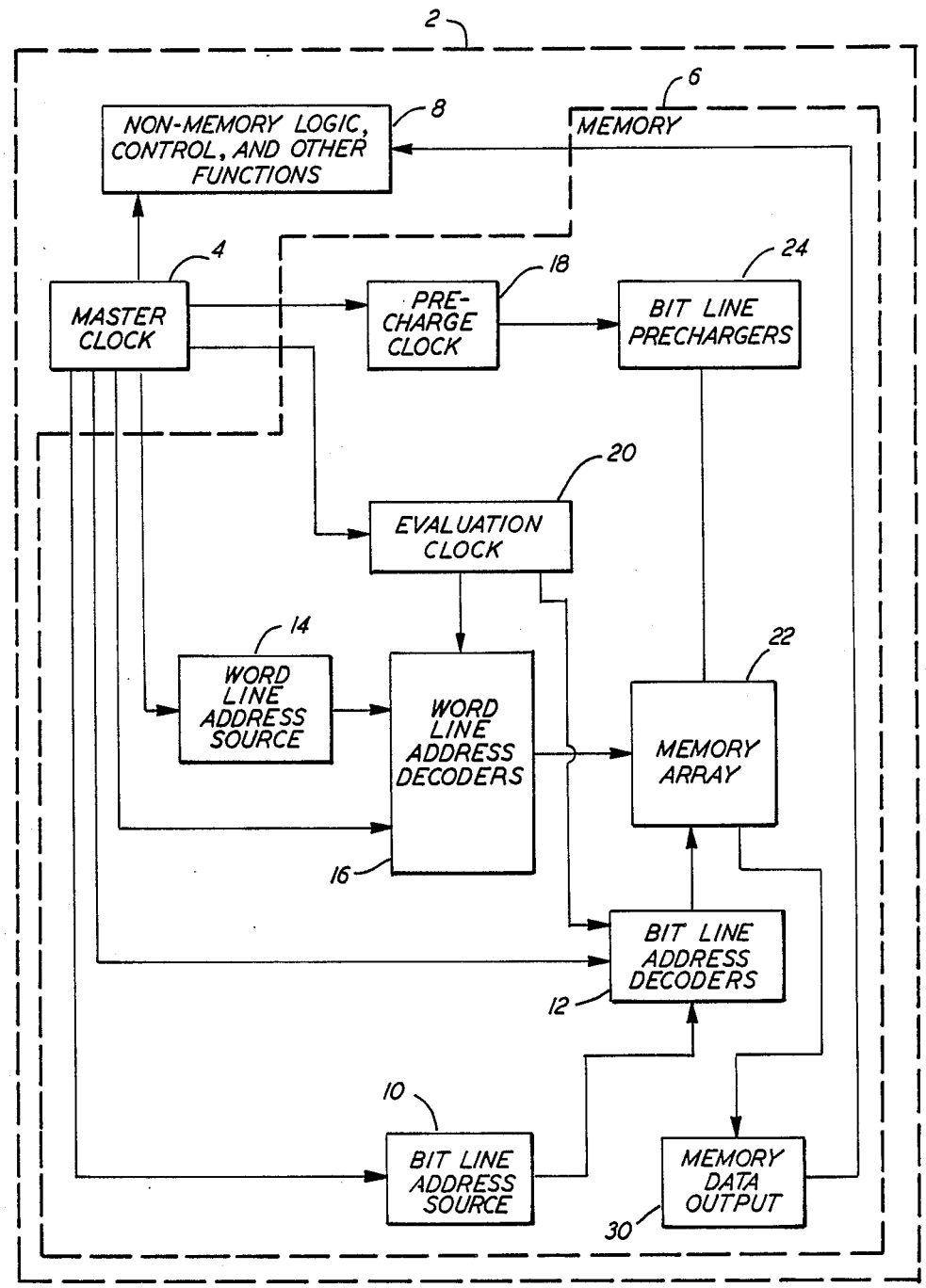
FIG. 1 is a block diagram of a prior art on-chip memory to which the present invention is applicable.

Turning to FIG. 1, there is shown a prior art semiconductor monolithic integrated circuit (IC) in a semiconductor body or chip 2. The IC 2 includes a master clock 4 whose clock cycles time the on-chip memory portion 6 of the circuit as well as other circuit portions 8 providing, for example, non-memory logic, control and other desired functions. The on-chip memory portion 6 includes bit line address source 10, bit line address decoders 12, word line address source 14, word line address decoders 16 and memory cell evaluation clock 20, all of the foregoing being connected to, and timed by, master clock 4.

The decoders 12 and 16 are connected to memory cell array 22, which is connected to bit line pre-chargers 24, controlled by pre-charge clock 18. Memory cell evaluation clock 20 is connected to decoders 12 and 16. Memory output data 30 is available to non-memory circuit portions 8. It will be apparent from FIG. 1 that all of the cyclical operations of memory 6 are synchronized with, and timed by, the clock cycle output of master clock 4 of the integrated circuit with which the memory is integrated on-chip.

Figure 2A:
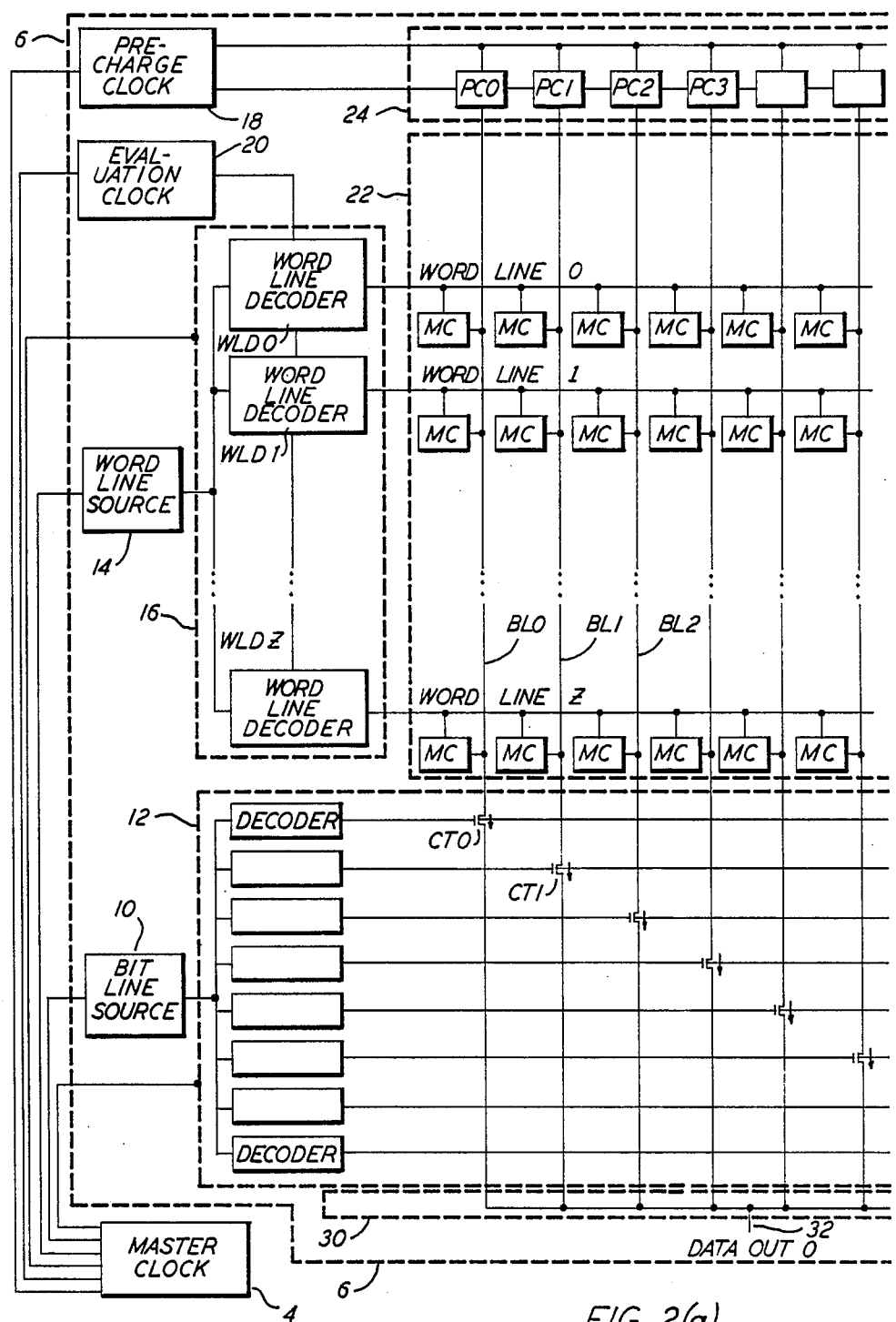
FIGS. 2a and 2b is a semi-schematic detailed diagram of a portion of the semiconductor memory shown in FIG. 1.
Figure 2B:
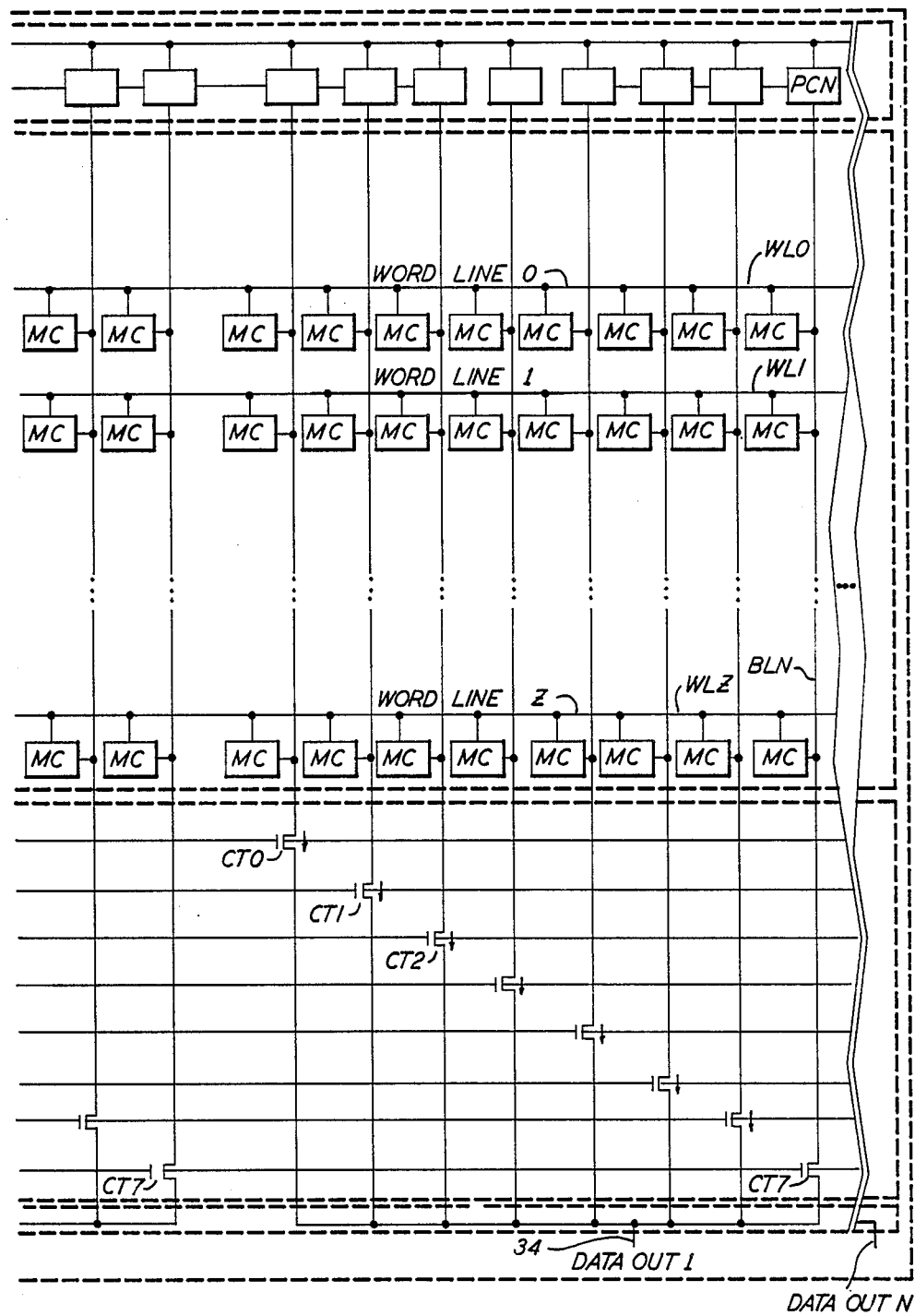

FIGS. 2a and 2b show additional details of portions of the memory 6 of FIG. 1. The memory structure shown in FIG. 2 includes details of the memory array 22, which has a matrix of mutually perpendicular bit lines BL0, BL1, BL2, . . . , BLN and word lines WL0, WL1, WL2, . . . , WLZ, at each intersection of which is provided a memory cell MC of conventional format known to the art. The bit lines are connected to, and served by, pre-charger cells PC0, PC1, PC2, . . . , PCN, one for each bit line. All of the pre-charger cells are connected to the pre-charge clock 18. The pre-charger cells drive each of the bit lines to a known state, such as the high voltage level of the memory, when the pre-charge clock 18 is at a corresponding level (e.g., high voltage level). The bit lines are connected in connected in parallel groups or sets to one or more, here shown as two, data out lines 32 and 34 respectively. The number of bit line groups determines the number of bits in an output word of the memory.

Word line selection is provided by word line address decoders 16, which include decoders WLD0, WLD1, WLD2, . . . , WLDZ, one for each word line, connected in parallel to the word line address source 14, the addresses typically being sequential. The bit line decoders are operably connected to their associated bit lines in each bit line group by sets of respective transistors CT0, CT1, . . . , CT7 associated with each bit line group. Readout of memory 6 is controlled by the output of the evaluation clock 20, which is connected to all of the word line address decoders 16 and bit line address decoders 12.

As mentioned heretofore, all of the individual elements of the memory 6 described thus far are conventional, and each such element may be constructed in accordance with prior art known technology and is, in and of itself, not the subject of the present invention.

As is well known to those skilled in the art, the timing of the high and low voltage segments of the word line and bit line addresses from sources 14 and 10, in relation to the timing of evaluation signals from the memory cell evaluation clock 20, determines which of the memory cells of array 22 is addressed in any given access clock cycle. In a typical readout operation of the memory 6, for example, as understood and appreciated by those skilled in the art, when the pre-charge clock 18 output is at voltage high, all of the word line decoders 16 are inactive and all of the word lines are at voltage low. When the output of the pre-charge clock 18 goes low and the output evaluation clock 20 is high, a selected one of the word line decoders, as determined by the inputs from word line address source 14, fires and its word line goes from voltage low to voltage high.

When this selected word line goes high, it opens the gates of all of the memory cells associated with that word line to their respective bit lines. The information stored in each such memory cell is thereby made available for sensing by its associated bit line. Through the bit line address decoders 12, which are also activated when the evaluation clock 20 is high, one of the bit lines in each bit line group is selected in accordance with the bit line address inputs. The data on the selected bit lines is read out of the memory on data out lines (e.g., lines 32 and 34). In the exemplary memory shown in FIG. 1, the bit line decoders constitute an 8 to 1 multiplexer, and hence normally only one of 8 bit lines in a group is selected in a given access clock cycle.

As previously indicated, the bit line addresses to the bit line address decoders 12 are normally sequential. Hence, in the memory of FIG. 1 and FIGS. 2a and 2b the bit line address cycles in sequence from each to the next and on to the last bit line of each group, and then returns to the first or zero bit line of each group.

FIG. 3 is a timing diagram of the principal voltage signals occurring in normal operation of the memory of FIGS. 1 and 2a and 2b. Waveforms PH1 and PH2 represent the two non-overlapping phases of the output of on-chip master clock 4 from which the memory 6 derives its timing. The pre-charge clock 18 is synchronized with PH1, so in every clock cycle voltage high of PH1 the bit lines are pre-charged to voltage high.

The evaluation clock 20 is synchronous with PH2. This is evident in the timing diagram of FIG. 3 by the pulsing to voltage high of a selected word line in synchronism with the PH2 voltage high during each clock cycle that the particular word line remains selected, and by the similarly synchronized pulsing to voltage high of the bit line decoders 12.

Normally during an evaluation or exercising of the memory such as a read out of the memory cells, which is timed by evaluation clock 20 and hence synchronized with a voltage high PH2, if a ZERO is stored in the memory cell being evaluated, it will pull its bit line low. When a ONE is stored in the memory cell being evaluated, then its bit line stays high. Thus, as shown in FIG. 3, for an evaluation of selected word line WLN, indicated in the timing diagram when word line WLN is at voltage high in synchronism with PH2, the memory cell at word line WLN and bit line zero BL0 is shown to contain a ZERO by the indication in the diagram that BL0 is then at voltage low.

Simultaneously, bit line four BL4 is shown in FIG. 3 to be at voltage high and BL14 at voltage low, which means that in this evaluation cycle these three memory cells contain respectively a ZERO, a ONE and a ZERO. Correspondingly, for the memory cells associated with word line N +1, evaluation at bit lines BL0, BL4 and BL14 shows in the diagram of FIG. 3 that the memory cells contain a ONE, a ZERO and a ZERO respectively. And for cells at the same bit lines but associated with word line N +2, evaluation shows the cells contain respectively ONE, ONE and ZERO.

Figure 4:
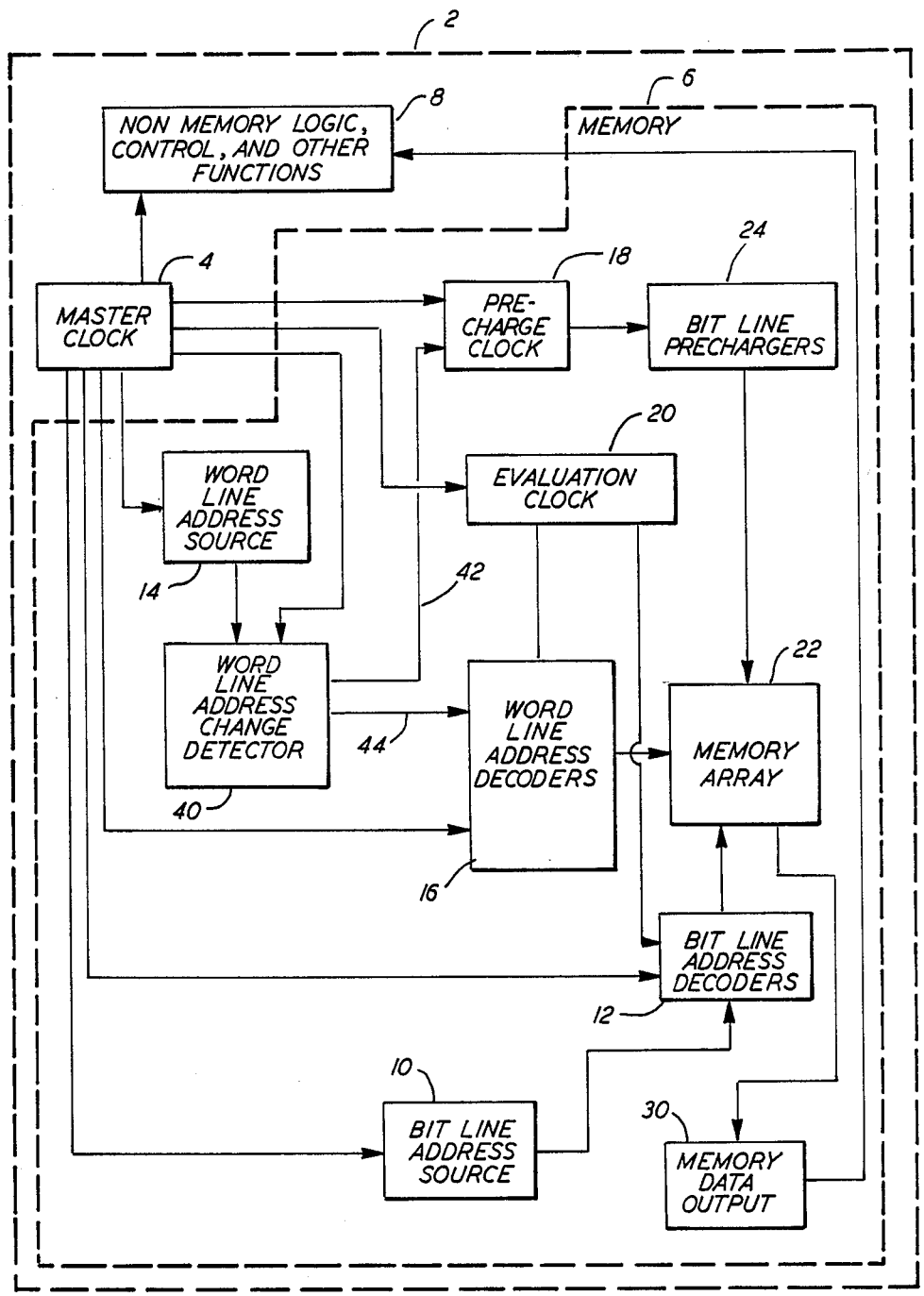
FIG. 4 is a block diagram similar to FIG. 1, but showing modifications and improvements according to the present invention.

In accordance with this invention, reduced frequency of pre-charging of the bit lines, and correspondingly reduced power consumption, is attained by pre-charging the bit lines only when there is a change of word line address. FIG. 4 shows a memory structure similar to FIG. 3 but embodying improvements and modifications according to the present invention. As shown in FIG. 4, the output addresses from word line address source 14 are supplied to a word line address change detector 40, which monitors the word line address in each clock cycle and detects changes in word line addresses from one cycle to the next. This detection is accomplished by comparing the word line address of each given cycle with that of the next cycle. The output of detector 40 is connected by line 42 to pre-charge clock 18 so as to disenable pre-charging of the bit lines for all clock cycles except when a word line address change is detected.

Any suitable form of word line address change detector 40 may be utilized within the contemplation of the present invention. For example, any suitable prior art means for storing the word line address of a given cycle and comparing it with the word line address of the next cycle may be used. For instance, a comparator circuit of the counter type may be used. Alternatively, one of the sample "Equality and Relative Magnitude Detection" circuits shown in the "Logic Handbook" of Digital Equipment Corporation, Copyright 1969 edition, at page 310 et seq., may be so utilized. Also, address change detectors of the type shown and described in U.S. Pat. No. 4,417,328, or in FIGS. 6 and 7 of U.S. Pat. No. 4,514,831 may be so utilized. Both of the aforementioned patents are incorporated by reference herein.

Regardless of the specific word line address change detection means employed, the present invention contemplates that detection, in each clock cycle, of no change in word line address from that of the previous cycle shall disenable the pre-charging of the bit lines for that cycle.

The output of detector 40 is connected by line 44 to word line address decoder 16 to sustain the activation of the decoder 16 for those clock cycles for which no word line address change is detected, thereby providing a further reduction in power consumption of the memory. Conversely, detection of a word line address change from one cycle to the next triggers the enabling of the pre-charge clock 18 output and causes pre-charging of all of the bit lines, as well as deactivation of word line decoders 16.

Figure 5:
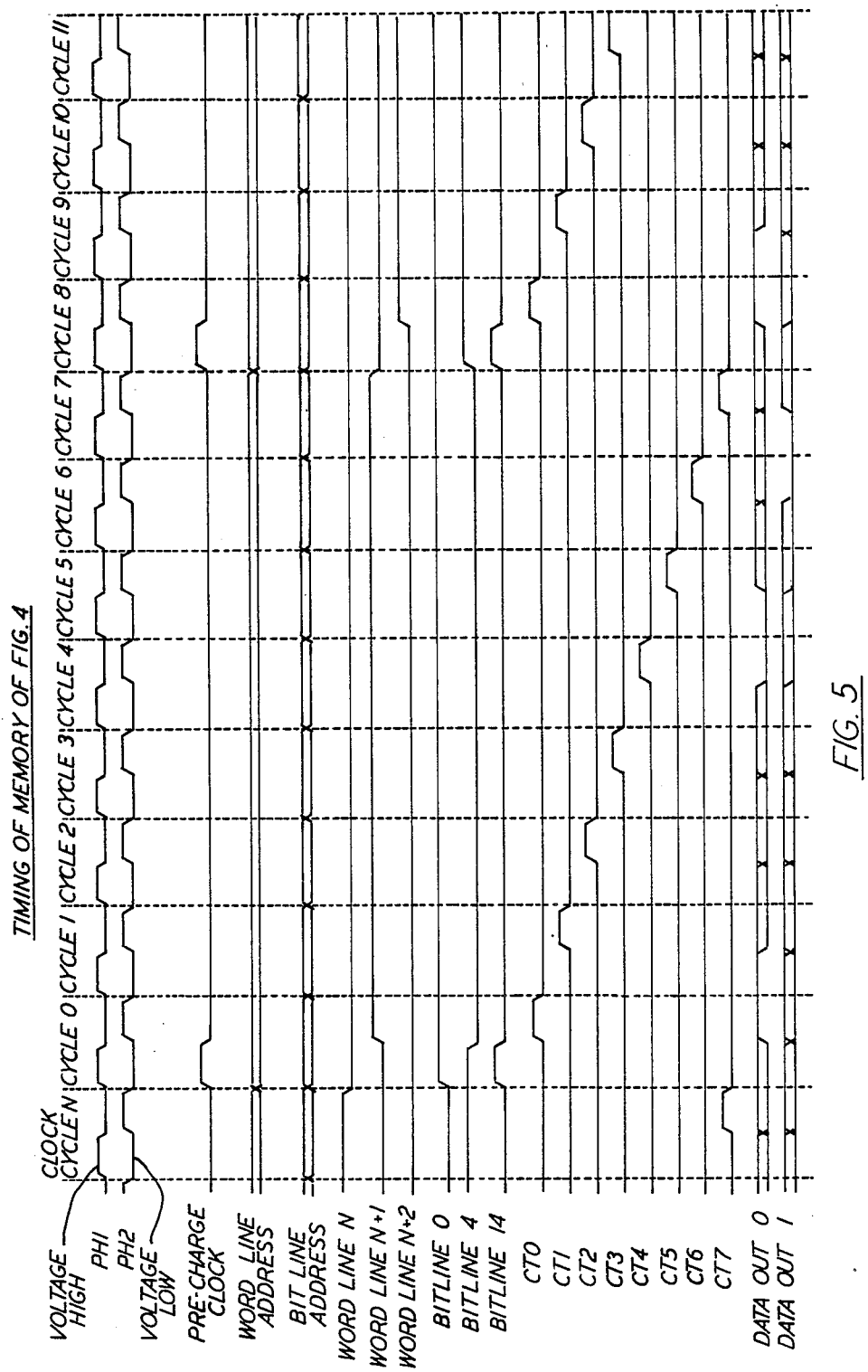
FIG. 5 is a timing diagram similar to FIG. 3 but illustrating the operation of the modified memory of FIG. 4 according to the invention.

FIG. 5 slows a timing diagram similar to FIG. 3, but of the improved memory of FIG. 4 embodying and operating in accordance with the present invention. Comparing FIG. 5 with FIG. 3, it will be noted that the bit lines of FIG. 5 are not pre-charged every cycle as they are in FIG. 3. In FIG. 5 the bit lines are pre-charged, in synchronization with PH1, only when there is a change in the word line address, thereby affording a significant reduction in power consumption of the memory of FIG. 4.

Also in FIG. 5 it will be noted that each given word line is activated only once in every eight cycles and remains high throughout this eight cycle period, so the power consumption involved in firing the word line decoders 16 every cycle, as is required in the memory of FIG. 3, is thereby avoided, thus providing a further reduction in power consumption of the memory of FIG. 4.

The bit line decoders in FIG. 5, as in FIG. 3, are active every cycle. But the significant reduction in bit line pre-charging, as well as frequency of word line decoder activation, provides a substantial effective reduction in power consumption for the memory of FIG. 4 in comparison with that of FIG. 3, without being memory cell technology dependent and without affecting operating speed.

Thus it will be apparent that the present invention resides basically in selective pre-charging of the bit lines of a synchronously operated on-chip semiconductor memory only when a word line address change occurs. The consequent reduction in pre-charging power consumption, which is a major constituent of all the power consumed by the memory, is essentially proportional to the number of bit lines per word line in each bit line group of the memory. For example, if there are eight bit lines in a data out group per word line, the power reduction factor is eight to one. It is, of course, recognized that if there are jumps, branches or other non-sequential address events which occur at addresses other than multiples of eight in such an exemplary memory, then the power reduction factor resulting from the present invention would be somewhat less, but still significant. In any event it will be apparent that the present invention affords a substantial reduction of on-chip memory power consumption in comparison with that of prior art on-chip semiconductor memories.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. In a power efficient semiconductor memory having word lines and bit lines adapted to be controlled in synchronism with successive clock cycles, means defining respective word lines that are always in an activated state until a word line address change occurs, pre-charging means for pre-charging the bit lines in each clock cycle, a word line address source for supplying a word line address in each clock cycle, word line address change detector means connected to the word line address source for generating an output responsive to detection of a change in word line addresses from one clock cycle to the next, and means responsive to the output of said detector means for disenabling the pre-charging means in all clock cycles except for those clock cycles when a word line address change occurs, whereby power is conserved by an activated word line which is activated until a word line address change occurs, and by the pre-charging of respective bit lines caused only in response to the detection of said word line address change.

2. A semiconductor memory as defined in claim 1 wherein the word lines are accessed through word line address decoders timed by the clock cycle input, and means is provided responsive to the output of the detector means for sustaining the word line address decoders except when a change of word line address occurs.

3. In a power efficient semiconductor integrated circuit including a clock for generating timing signals in successive clock cycles and a memory array having a plurality of word lines and associated intersecting bit lines and having respective memory cells situated at the respective intersections of the bit lines and word lines,
   means defining respective word lines that are always in an activated state until a word line address change occurs,
   pre-charging means associated with the bit lines and timed by said clock cycle for pre-charging each bit line in each clock cycles to a selected state facilitating evaluation of the memory cells associated with the pre-charged bit line,
   a word line address source for supplying word line addresses in each clock cycle,
   a word line address change detector connected to the word line address source for comparing word line addresses in successive clock cycles and generating an output responsive to the detection of change in the word line addresses from one clock cycle to the next, and
   means responsive to the output of the word line address change detector for disenabling said pre-charging means except when the word line address changes, whereby power is conserved by an activated word line which is activated until a word line address change occurs, and by the pre-charging of respective bit lines caused only in response to the detection of said word line address change.

4. In a power efficient semiconductor integrated circuit including a clock for generating timing signals in successive clock cycles and a memory array having a plurality of word lines and associated intersecting bit lines equal in number to a multiple of the plurality of word lines and having respective memory cells situated at the respective intersecting of the bit lines and word lines,
   means defining respective word lines that are always in an activated state until a word line address change occurs,
   pre-charging means associated with the bit lines and timed by said clock cycles for pre-charging each bit line in each clock cycle to a selected state facilitating evaluation of the memory cells associated with the pre-charged bit line,
   a word line address source for supplying word line addresses in each clock cycle,
   a word line address change detector connected to the word line address source for comparing word line addresses in successive clock cycles and generating an output responsive to the detection of change in the word line addresses from one clock cycle to the next, and
   means responsive to the output of the word line address change detector for disenabling said pre-charging means in each clock cycle except when the word address changes, whereby power is conserved by an activated word line which is activated until a word line address change occurs, and by the pre-charging of respective bit lines caused only in response to the detection of said word line address change.

5. In a power efficient semiconductor monolithic integrated circuit including a clock for generating timing signals in successive clock cycles and a memory array having a plurality of word lines and associated intersecting bit lines equal in number to a multiple of the plurality of word lines and having respective memory cells situated at the respective intersections of the bit lines and word lines, said integrated circuit further including a bit line address source and a word line address source timed by said clock cycles,
   means defining respective word lines that are always in an activated state until a word line address change occurs,
   pre-charging means connected to the bit lines and timed by said clock cycles for pre-charging each bit line to a selected state facilitating evaluation of the memory cells associated with the pre-charged bit lines,
   a bit line address decoder connected to each bit line, each of said bit line address decoders being further connected to said bit line address source in each clock cycle,
   a word line address decoder connected to each word line, each of said word line address decoders being further connected to said word line address source in each clock cycle,
   a word line address change detector connected to the word line address source for comparing word line addresses in successive clock cycles and generating an output responsive to the detection of change in the word line addresses from one clock cycle to the next, and
   means responsive to the output of the word line address change detector and operatively connected thereto for disenabling said pre-charging means and for sustaining activation of said word line address decoder in each clock cycle except when the word line address changes, whereby power is conserved by an activated word line which is activated until a wordline address change occurs, and by the pre-charging of respective bit lines caused only in response to the detection of said word line address change.

* * * * *